(12) United States Patent
Chuang et al.

(10) Patent No.: US 11,075,224 B2
(45) Date of Patent: Jul. 27, 2021

(54) DISPLAY DEVICE AND METHOD FOR MANUFACTURING SAME

(71) Applicant: AU OPTRONICS CORPORATION, Hsin-Chu (TW)

(72) Inventors: Hao-An Chuang, Hsin-Chu (TW); Wen-Fang Sung, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 16 days.

(21) Appl. No.: 16/813,861

(22) Filed: Mar. 10, 2020

(65) Prior Publication Data

US 2020/0212072 A1 Jul. 2, 2020

Related U.S. Application Data

(62) Division of application No. 15/923,299, filed on Mar. 16, 2018, now Pat. No. 10,622,385.

(30) Foreign Application Priority Data

Apr. 28, 2017 (TW) .................................. 106114340

(51) Int. Cl.
*H01L 27/12* (2006.01)
*G02F 1/13* (2006.01)
(Continued)

(52) U.S. Cl.
CPC .......... *H01L 27/124* (2013.01); *G02F 1/1303* (2013.01); *G02F 1/1339* (2013.01); *G02F 1/1368* (2013.01); *G02F 1/13452* (2013.01); *G02F 1/136213* (2013.01); *G02F 1/136286* (2013.01); *G02F 1/136295* (2021.01); *H05K 1/117* (2013.01); *H05K 1/118* (2013.01); *H05K 1/147* (2013.01); *H05K 3/0052* (2013.01); *H05K 3/361* (2013.01); *H05K 2201/0919* (2013.01); *H05K 2201/10136* (2013.01); *H05K 2203/0228* (2013.01); *H05K 2203/0278* (2013.01); *H05K 2203/1131* (2013.01)

(58) Field of Classification Search
CPC ...... H01L 27/124; G02F 1/1303; H05K 1/147
See application file for complete search history.

(56) References Cited

U.S. PATENT DOCUMENTS

| 6,204,906 B1 * | 3/2001 | Tannas, Jr. | ............ G02F 1/1339 349/153 |
| 10,374,028 B1 * | 8/2019 | Lim | .................. H01L 23/49838 |

(Continued)

*Primary Examiner* — Eugene Lee
(74) *Attorney, Agent, or Firm* — Tim Tingkang Xia, Esq.; Locke Lord LLP

(57) ABSTRACT

A display device includes a first substrate and a flexible circuit board. Data lines, scan lines, thin film transistors, gate contacts, and source contacts are disposed on the first substrate. The scan lines are intersected with the data lines. The thin film transistors are respectively connected to the data lines and the scan lines. The gate contacts are connected to the scan lines. The source contacts are connected to the data lines. The display device further includes first conductive patterns disposed on a side of the first substrate, and the first conductive patterns are connected to at least some of the gate contacts on the side of the first substrate. First pads of the flexible circuit board are connected to the first conductive patterns.

4 Claims, 11 Drawing Sheets

(51) Int. Cl.
*H05K 1/14* (2006.01)
*H05K 1/11* (2006.01)
*H05K 3/00* (2006.01)
*H05K 3/36* (2006.01)
*G02F 1/1339* (2006.01)
*G02F 1/1362* (2006.01)
*G02F 1/1368* (2006.01)
*G02F 1/1345* (2006.01)

(56) References Cited

U.S. PATENT DOCUMENTS

| | | | |
|---|---|---|---|
| 2014/0160694 A1* | 6/2014 | Yoon | H05K 13/00 |
| | | | 361/749 |
| 2015/0212350 A1* | 7/2015 | Niiyama | B32B 3/08 |
| | | | 349/122 |
| 2016/0291723 A1* | 10/2016 | Kurasawa | H05K 1/117 |
| 2018/0068940 A1* | 3/2018 | Oh | H01L 23/49838 |
| 2018/0173042 A1* | 6/2018 | Kim | H01L 24/29 |
| 2020/0013803 A1* | 1/2020 | Jang | H01L 27/124 |
| 2021/0063802 A1* | 3/2021 | Huang | G02F 1/133305 |

\* cited by examiner

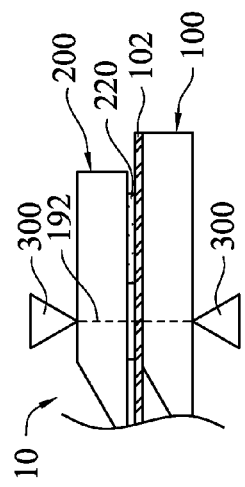
FIG. 7A
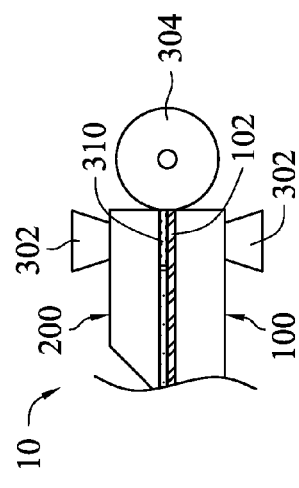
FIG. 7B
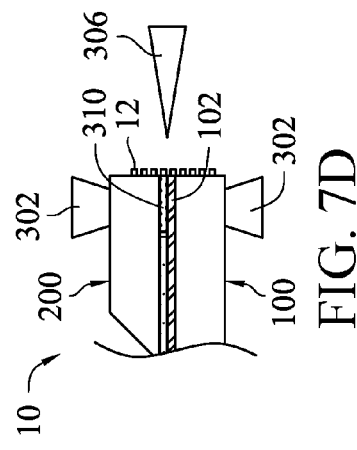
FIG. 7C
FIG. 7D
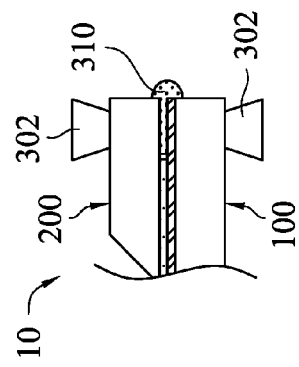
FIG. 7E
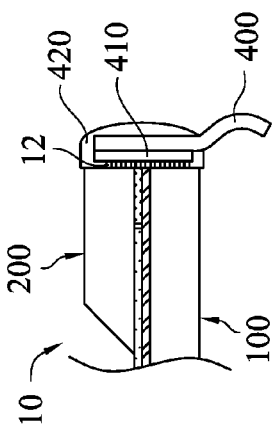
FIG. 7F
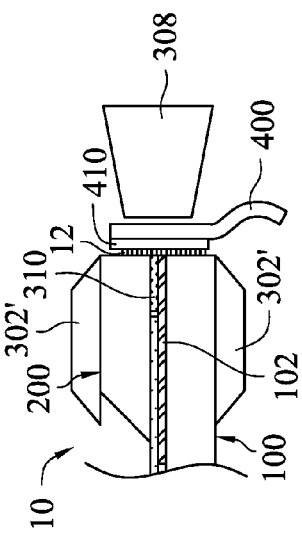

DISPLAY DEVICE AND METHOD FOR MANUFACTURING SAME

CROSS-REFERENCE TO RELATED PATENT APPLICATION

This application is a divisional application of U.S. patent application Ser. No. 15/923,299, filed on Mar. 16, 2018, which itself claims priority to and the benefit of, pursuant to 35 U.S.C. § 119(a), patent application Ser. No. 106114340 filed in Taiwan on Apr. 28, 2017. The disclosure of the above application is incorporated herein in its entirety by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference were individually incorporated by reference.

FIELD

The present invention relates to a display device and a method for manufacturing same.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Conventional flat panel displays include liquid crystal displays, plasma displays, organic light emitting diode displays, or the like. The displays may be applied to consumer electronic or computer products such as mobile phones, camcorders, notebooks, desktop displays, and television sets.

However, the product life cycles of the customer electronic products are relatively short, and therefore inventory or even burden on the environment may easily occur if the products are not appropriately treated in the manufacturing process or after being phased out by the market. In addition, there are various requirements for the sizes of displays, and therefore the design of undiversified and repeated sizes is apt to cause an excessively heavy inventory burden. Therefore, how to eliminate the restrain of the display size has become a subject to research.

SUMMARY

In order to resolve the aforementioned problem, the present invention provides a display device of which the size can be reset, and a method for manufacturing same.

An embodiment of the present invention provides a display device, comprises a first substrate; and data lines, scan lines, and a plurality of pixels that are disposed on the first substrate, wherein the scan lines are intersected with the data lines, each pixel comprises a thin film transistor, a gate contact, and a source contact. The thin film transistor is respectively coupled to at least one of the data lines and the scan lines; the gate contacts are connected to the scan lines; and the source contacts are connected to the data lines. The display device further comprises first conductive patterns disposed on a side of the first substrate, and the first conductive patterns are connected to at least some of the gate contacts on the side of the first substrate. The display device further comprises a flexible circuit board, wherein first pads of the flexible circuit board are connected to the first conductive patterns.

Another embodiment of the present invention provides a method for manufacturing a display device, comprising: cutting a display panel to expose contacts out of a side of the display panel; then filling a sealing member in the side, and removing a part of the sealing member to still expose the contacts out of the side of the display panel; subsequently forming conductive patterns on the side of the display panel, the conductive patterns being connected to the contacts; and finally connecting pads on a flexible circuit board to the conductive patterns.

The present invention provides a display device of which the size can be reset and a method for manufacturing same. After a display panel is cut, conductive layers and contacts are exposed out of a side of the display panel, and then conductive patterns are further disposed on the side of the display panel, so that a display device of a desired size can be obtained by connecting a flexible circuit board and the display panel by means of the conductive patterns.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

To make the aforementioned and other objectives, features, advantages and embodiments of the present disclosure more comprehensible, the accompanying drawings are described as follows:

FIG. 7A to FIG. 7F respectively are schematic sectional views of a display device in different steps of assembly according to an embodiment of the present invention.

DETAILED DESCRIPTION

The spirit of the present invention is clearly described through the figures and the detailed description, changes and modifications can be made to the technology taught in the present invention by persons of ordinary skill in the art after learning about the preferred embodiments of the present invention.

Figure 1:
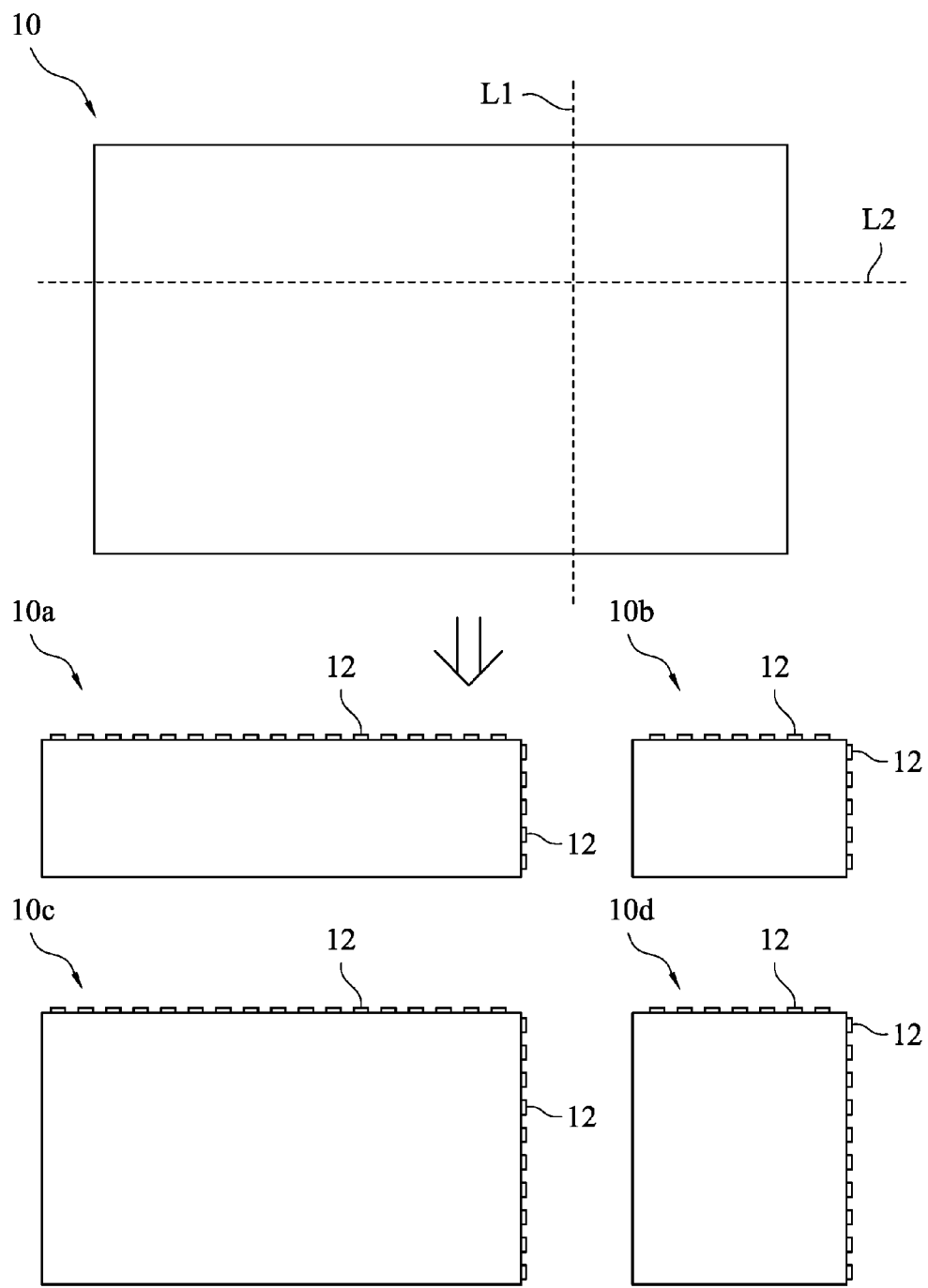
FIG. 1 is a schematic top view of a display device in different manufacturing steps according to an embodiment of the present invention.

Referring to FIG. 1, FIG. 1 is a schematic top view of a display device in different manufacturing steps according to an embodiment of the present invention. The present invention provides a display device capable of being remanufactured, and a method for manufacturing same. For example, a display panel 10 of a relatively large size is cut, along cutting lines L1 and L2, for example, and then becomes a plurality of display panels 10a, 10b, 10c, and 10d of relatively small sizes. The sizes of the display panels 10a to 10d may be the same or different. That is, the efficacy of maximum utilization of the display panel 10 can be achieved in combination with different requirements for sizes. After the display panel 10 is cut into the display panels 10a to 10d, contacts of the display panels 10a to 10d are exposed out of sides thereof. Conductive patterns 12 are then disposed on the sides of the display panels 10a to 10d, and connected to the contacts of the display panels 10a to 10d, so that the display panels 10a to 10d are able to be connected to circuit boards by means of the conductive patterns 12, to form display devices.

Figure 2:
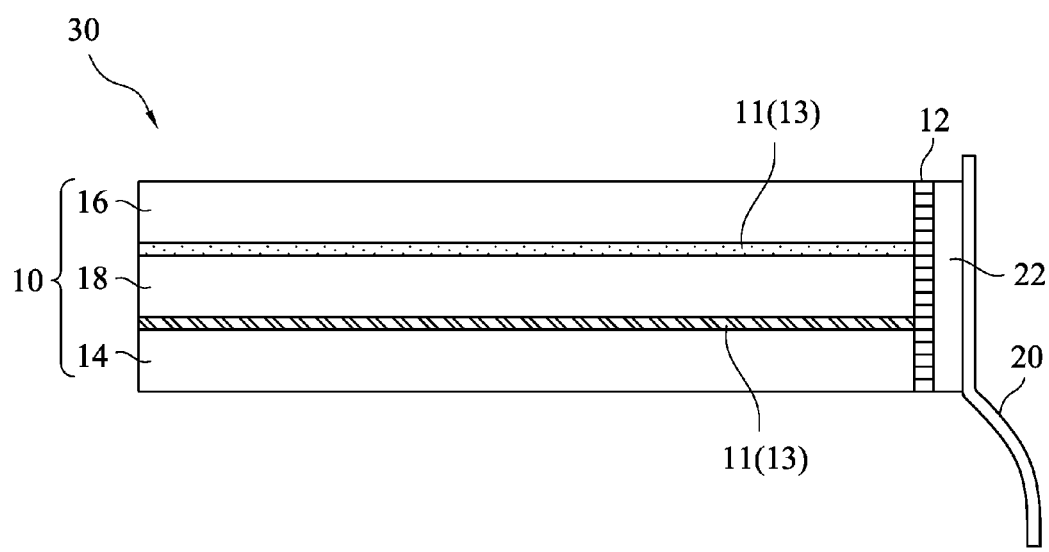
FIG. 2 is a schematic sectional view of a display device according to another embodiment of the present invention.

Referring to FIG. 2, FIG. 2 is a schematic sectional view of a display device according to another embodiment of the present invention. A display device 30 includes a display panel 10 and a circuit board 20. The display panel 10 includes a driving substrate 14, an opposite substrate 16, and a display medium 18 located between the driving substrate 14 and the opposite substrate 16. The driving substrate 14 and the opposite substrate 16 are each provided with at least one conductive layer 11. The conductive layers 11 are able to be patterned to serve as contacts 13 of the display panel 10. The contacts 13 may be exposed out of a side of the display panel 10, and conductive patterns 12 are disposed on the side of the display panel 10 and electrically connected to the contacts 13. The circuit board 20 is provided with pads 22 corresponding to the conductive patterns 12. The circuit board 20 is a flexible circuit board or a printed circuit board, for example. The circuit board 20 is connected to the conductive patterns 12, so as to connect the pads 22 to the conductive patterns 12, so that the display panel 10 and the circuit board 20 are electrically connected.

Figure 3:
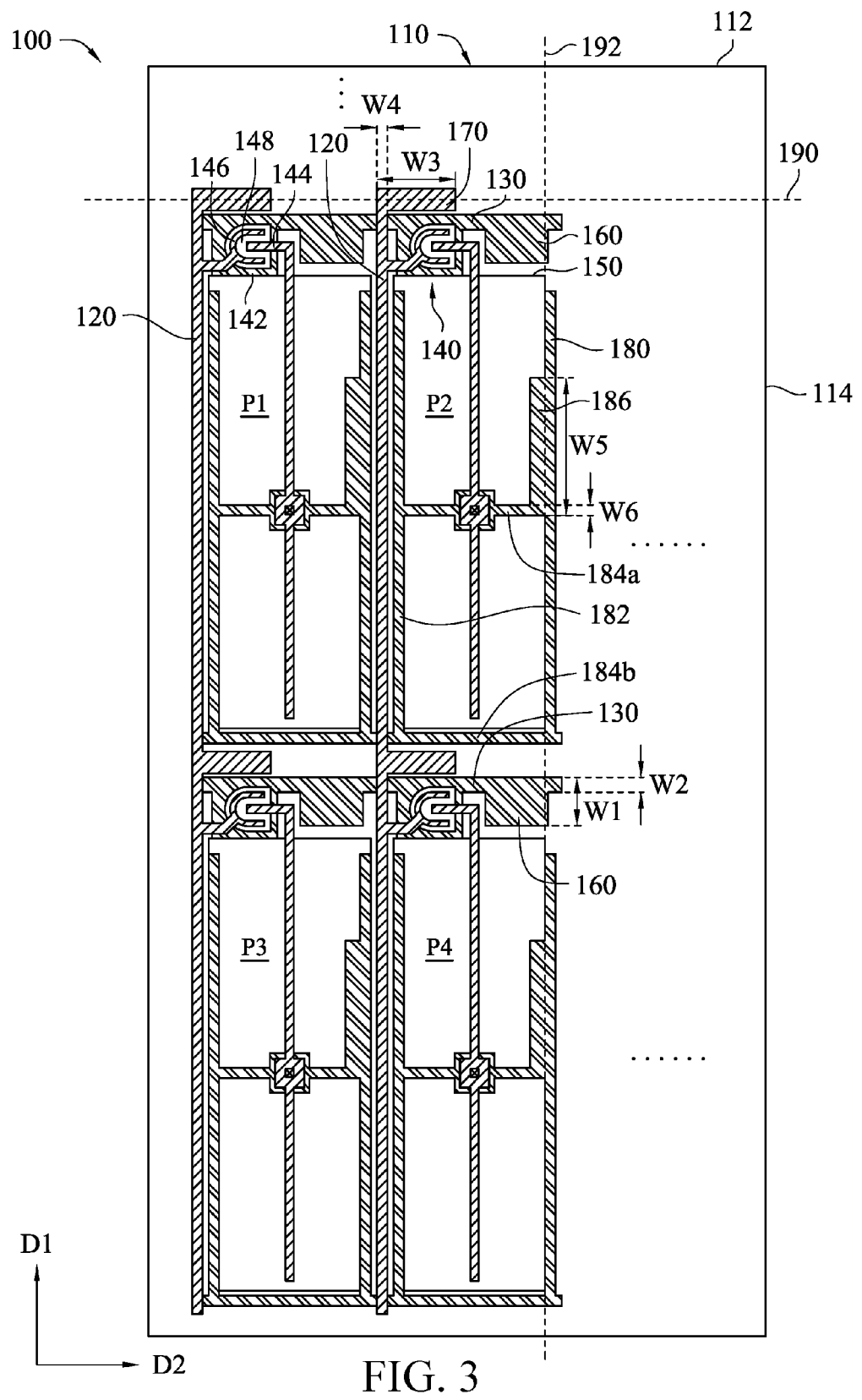
FIG. 3 is a schematic top view of a driving substrate in a display device according to an embodiment of the present invention.

Referring to FIG. 3, FIG. 3 is a schematic top view of a driving substrate in a display device according to an embodiment of the present invention. A driving substrate 100 includes a pixel array and a drive circuit. It should be noted that for figure concise, only a small part of the pixel array is shown in the figure, and actually the pixel array is not limited thereto.

The driving substrate 100 includes a first substrate 110, and a plurality of data lines 120, a plurality of scan lines 130, and a plurality of thin film transistors 140 that are disposed on the first substrate 110. In an embodiment, the display panel 10 has a first side edge 112 and a second side edge 114 that are adjacent to each other. A second direction D2 and a first direction D2 are respectively parallel to the first side edge 112 and the second side edge 114 of the display panel 10, and the first direction D1 is substantially perpendicular to the second direction D2. In an embodiment, the data lines 120 are substantially parallel to the first direction D1 (that is, substantially parallel to the second side edge 114), and the data lines 120 are also arranged substantially parallel one to another. The scan lines 130 are substantially parallel to the second direction D2 (that is, substantially parallel to the first side edge 112), and the scan lines 130 are also arranged substantially parallel one to another. The data lines 120 and the scan lines 130 define a plurality of pixels P1 to P4. The thin film transistors 140 are respectively disposed in the pixels P1 to P4, and are respectively connected to the corresponding data lines 120 and scan lines 130. Generally, the pixels P1 to P4 each corresponds to a thin film transistor 140. The thin film transistor 140 is connected to the corresponding data line 120 and scan line 130 (the connecting and coupling in the text generally may include direct or indirect connecting and coupling based on prediction of the embodiments in the present invention by persons of ordinary skill in the art according to the disclosure of the text and background knowledge thereof).

Each thin film transistor 140 includes a gate 142, a drain 144, a source 146, and a channel layer 148. In an embodiment, the gate 142 is disposed below the drain 144 and the source 146, and the channel layer 148 is disposed between the gate 142 and the drain 144 and between the gate 142 and the source 146 (the term "between" in the text does not indicate being in the same horizontal or vertical plane). In each of the pixels P1 to P4, the gate 142 is connected to the corresponding scan line 130, and the source 146 is connected to the corresponding data line 120. The driving substrate 100 further includes a plurality of pixel electrodes 150. The pixel electrodes 150 are respectively disposed in the pixels P1 to P4 and connected to the drains 144 of the corresponding thin film transistors 140.

The driving substrate 100 further includes a plurality of gate contacts 160. The gate contacts 160 are respectively disposed in the pixels P1 to P4 and connected to the corresponding scan lines 130. The width W1 of the gate contact 160 in the first direction D1 is greater than the width W2 of the scan line 130 in the first direction D1. In an embodiment, the gates 142, the scan lines 130, and the gate contacts 160 are manufactured by patterning one same conductive layer by using one same mask. That is, the gates 142, the scan lines 130, and the gate contacts 160 are formed structures in the same layer.

The driving substrate 100 further includes a plurality of source contacts 170. The source contacts 170 are respectively disposed in the pixels P1 to P4 and connected to the corresponding data lines 120. The width W3 of the source contact 170 in the second direction D2 is greater than the width W4 of the data line 120 in the second direction D2, and the source contact 170 protrudes from the scan line 130. For example, the source contact 170 protrudes from the scan line 130 in a direction perpendicular to the extension direction of the scan line 130. In an embodiment, a projection of the source contact 170 on the first substrate 110 does not overlap with the scan line 130, so as to avoid generation of extra parasitic capacitance between the source contact 170 and the scan line 130. In an embodiment, the sources 146, the data lines 120, and the source contacts 170 are manufactured by patterning another conductive layer by using one same mask. That is, the sources 146, the data lines 120, and the source contacts 170 are formed structures in the same layer.

The driving substrate 100 further includes a first common line 180, a second common line 182, common line branches 184a and 184b, and a common contact 186. In an embodiment, the first common line 180 and the second common line 182 are substantially parallel to the first direction D1, and the first common line 180 and the second common line 182 are arranged substantially parallel one to another and respectively located at two opposite sides of the pixel electrode 150. The common contact 186 is connected to the first common line 180, the common line branch 184a is connected to the first common line 180 and the second common line 182 in the same pixel, and the common line branch 184b is connected to the first common line 180 and the second common line 182 in an adjacent pixel. The width W5 of the common contact 186 in the first direction D1 is greater than the width W6 of the common line branch 184a in the first direction D1. In an embodiment, the first common line 180, the second common line 182, the common line branches 184a and 184b and the common contact 186 are structures in the same layer manufactured by using one same mask as the gate 142, the scan line 130, and the gate contact 160. The first common line 180, the second common line 182, and the common line branches 184a and 184b, and the pixel electrode 150 are isolated one to another by means of an insulation layer, so as to form a storage capacitor. The common lines include the first common line 180, the second common line 182, and the common line branches 184a and 184b, and generally are used for providing a common voltage reference.

Figure 4:
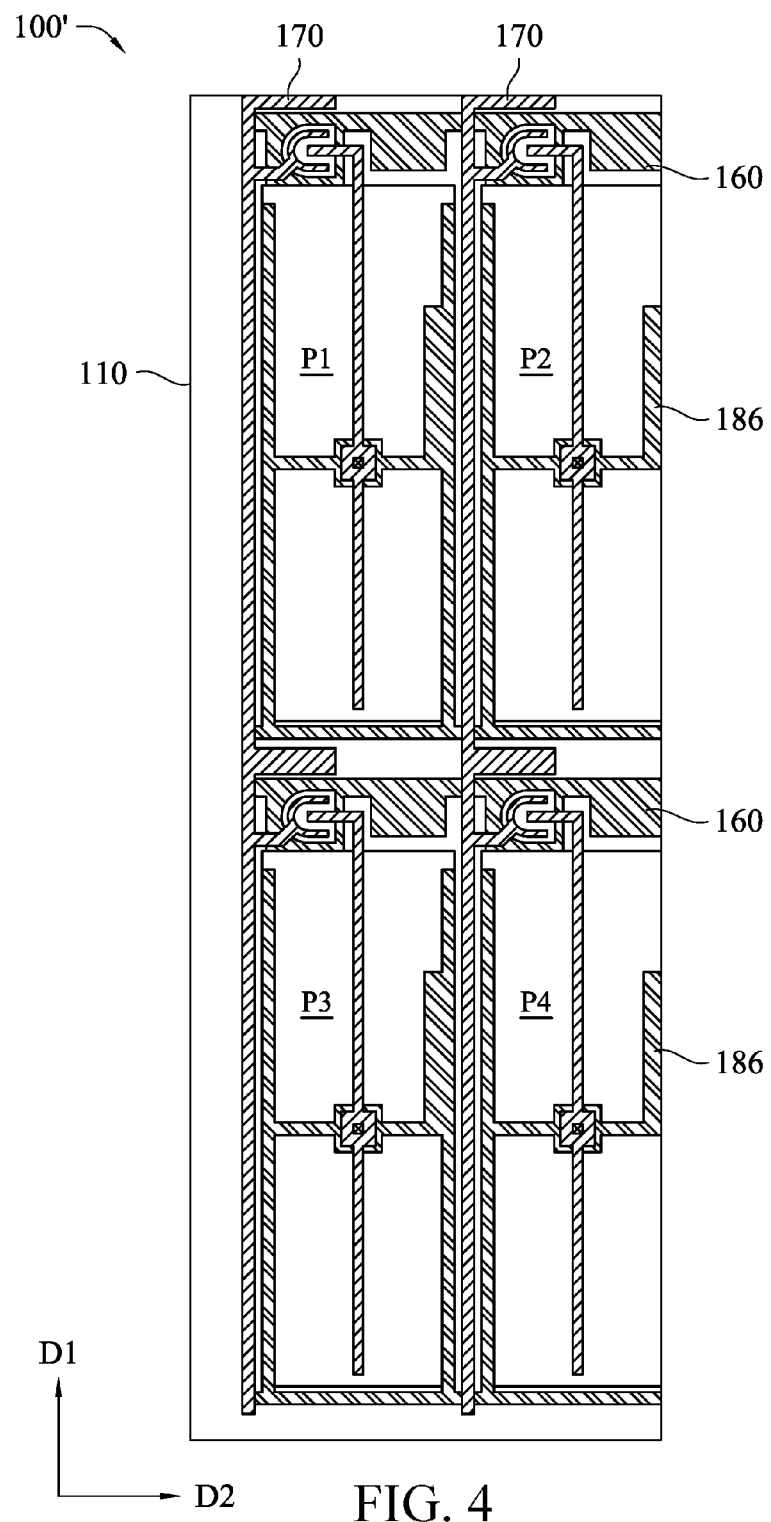
FIG. 4 is a schematic top view of the driving substrate in FIG. 3 after cutting.

During cutting of a display panel according to different requirements for sizes, cutting may be performed along predetermined scribe lines 190 and 192. For example, the structure obtained after the scribe line 190 passes through the pixels P1 and P2 and the scribe line 192 passes through the pixels P2 and P4 is shown in FIG. 4. In the display panel, the scribe lines 190 and 192 may be selected according to requirements for sizes as the pixels are all designed in a similar way.

Referring to FIG. 4, FIG. 4 is a schematic top view of the driving substrate in FIG. 3 after cutting. After cutting, a driving substrate 100' includes a 2*2 pixel array, in which the source contacts 170 of the pixels P1 and P2 are substantially flush with an upper edge of the first substrate 110 and exposed out of a side of the first substrate 110, the gate contacts 160 and the common contacts 186 of the pixels P2 and P4 are substantially flush with a side edge of the first substrate 110 and exposed out of a side of the first substrate 110, and the first common lines 180 (referring to FIG. 3) in the pixels P2 and P4 are also cut and removed. It should be noted that although the driving substrate 100' including a 2*2 pixel array is used as an example in this embodiment, the present invention actually is not limited thereto, and a user may cut a proper pixel array according to different requirements for sizes.

The display device of the present invention may be a flat panel display including a driving substrate, for example, a liquid crystal display, a plasma display, or an active matrix organic light emitting diode display. By means of the aforementioned method, a driving substrate 100 of a large size can be cut into a driving substrate 100' of a relatively small size, and a gate contact 160, a source contact 170, and a common contact 186 of a pixel at the outmost side are exposed out of a side edge of the driving substrate 100, for connecting a flexible circuit board.

Figure 5:
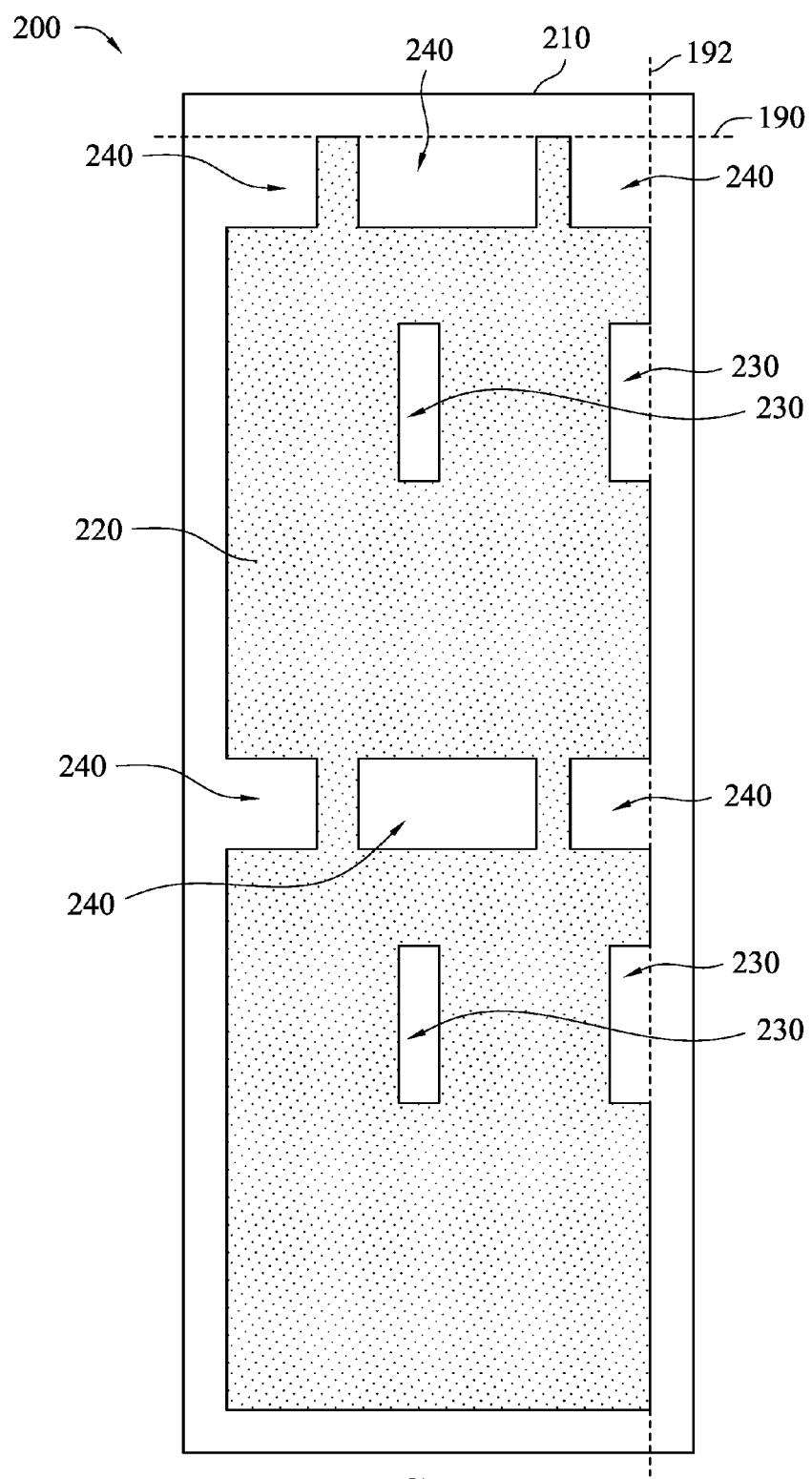
FIG. 5 and FIG. 6 are schematic top views of an opposite substrate in a display device according to different embodiments of the present invention.

Referring to FIG. 5, FIG. 5 is a schematic top view of an opposite substrate in a display device according to an embodiment of the present invention. The opposite substrate 200 may be, for example, a color filter substrate or a protective cover. In an embodiment, the opposite substrate 200 includes a second substrate 210 and a conductive layer 220 disposed on the second substrate 210. The conductive layer 220 may be used as a common electrode layer of the display device, and a liquid crystal capacitor is formed between the conductive layer 220 and the pixel electrode 150 (referring to FIG. 3). During cutting of the opposite substrate 200, cutting is performed by using the scribe lines 190 and 192 along predetermined paths. The conductive layer 220 after cutting is substantially flush with an edge of the second substrate 210 and exposed out of a side edge of the second substrate 210.

In an embodiment, the conductive layer 220 may further be patterned, for example, patterned using a process of photo lithography, so as to form a plurality of openings in the conductive layer 220. The positions of the openings correspond to the positions of the gate contacts 160 (referring to FIG. 3), the source contacts 170 (referring to FIG. 3), and the common contacts 186 (referring to FIG. 3). For example, the opening includes a first isolation block 230 and a second isolation block 240. A projection of the common contact 186 on the second substrate 210 falls within the first isolation block 230, and projections of the gate contact 160 and the source contact 170 on the second substrate 210 fall within the second isolation block 240. In another embodiment, the number of isolation blocks and the position thereof can be adjusted or changed, as long as the projections of the gate contact 160, the source contact 170, and the common contact 186 on the second substrate 210 do not overlap with the conductive layer 220.

Figure 6:
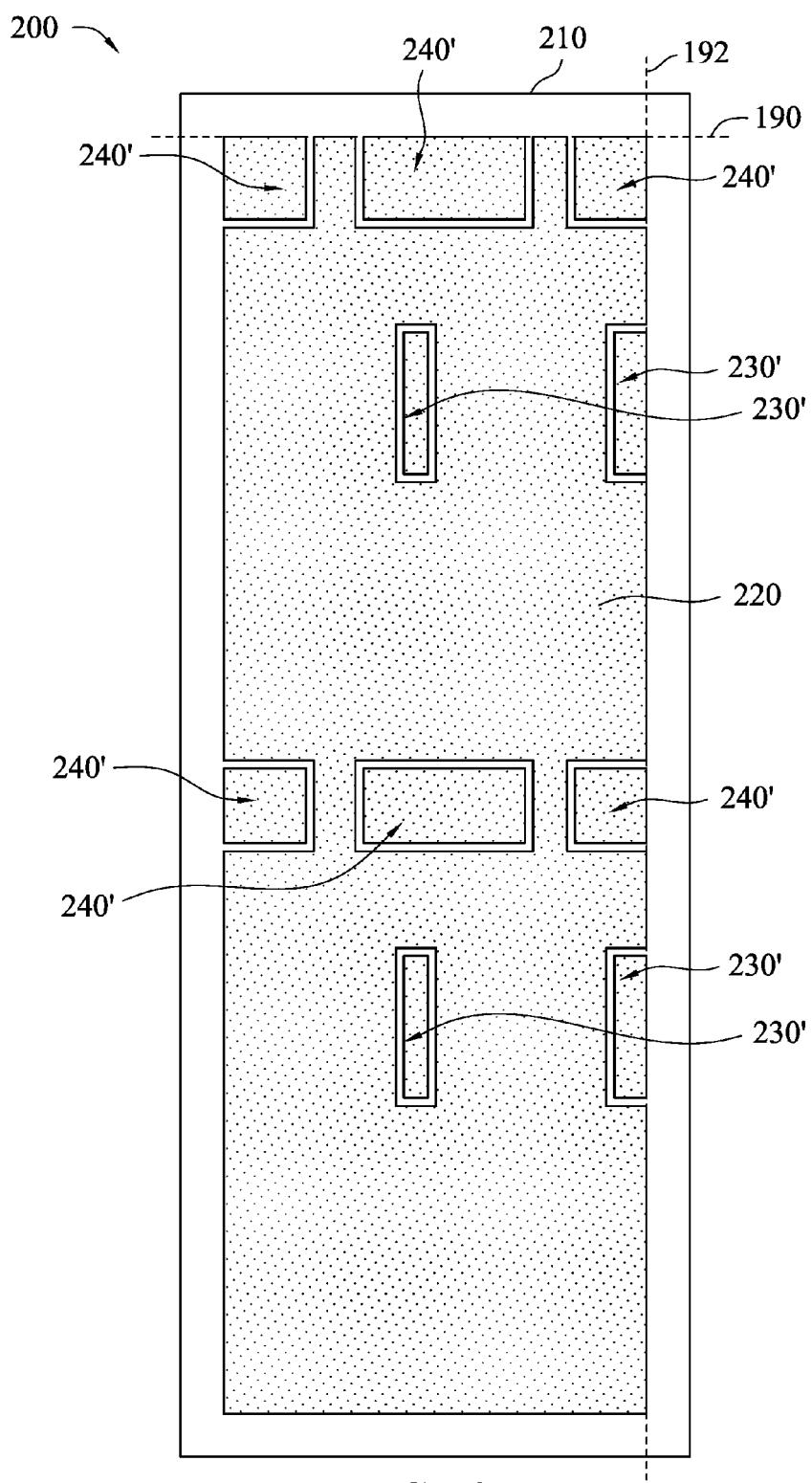

In another embodiment, as shown in FIG. 6, a first isolation block 230' and a second isolation block 240' may be defined by an isolation band formed by cutting the conductive layer 220 using a process such as laser cutting, so that the first isolation block 230' and the second isolation block 240' are electrically isolated from another conductive layer 220.

The foregoing first isolation blocks 230 and 230' and second isolation blocks 240 and 240' enable the gate contacts 160, the source contacts 170, and the common contacts 186 on the first substrate 110 not to overlap with the conductive layer 220 on the second substrate 210 in the normal direction of the display panel. In this way, during a subsequent process of manufacturing a conductive pattern on a side surface of the display panel, the conductive pattern is either connected to the gate contacts 160, the source contacts 170, and the common contacts 186, or connected to the conductive layer 220, instead of being simultaneously connected to the contacts and the conductive layer 220 to generate a short circuit phenomenon.

It should be noted that although the driving substrate 100 and opposite substrate 200 are described separately in the foregoing embodiments, actually the driving substrate 100, the opposite substrate 200, and the display medium between the driving substrate 100 and the opposite substrate 200 are first packaged and combined to form a display panel, and then the display panel is cut by using the scribe lines 190 and 192. That is, the scribe lines 190 and 192 cut the driving substrate 100 and the opposite substrate 200 at a time, so that the contacts of the pixels through which the scribe lines 190 and 192 pass are exposed out of the side of the driving substrate 100, and that the conductive layer 220 is exposed out of the side of the opposite substrate 200.

Referring to FIG. 7A to FIG. 7F, FIG. 7A to FIG. 7F respectively are schematic sectional views of a display device in different steps of assembly according to an embodiment of the present invention. First referring to FIG. 7A, the driving substrate 100, the opposite substrate 200, and the display medium (not shown) between the driving substrate 100 and the opposite substrate 200 have been packaged and combined to form the display panel 10. If there is a remanufacturing requirement subsequently, first a cutting instrument, for example, a cutting blade 300, is used to cut the display panel 10 along a scribe line, for example, the scribe line 192, so that contacts 102 (for example, the gate contacts, the source contacts, or the common contacts) on the driving substrate 100 are exposed out of a side of the driving substrate 100. In other embodiments, if cutting is performed along the scribe line 190 in FIG. 6, the conductive layer 220 on the opposite substrate 200 is exposed out of a side of the opposite substrate 200.

Subsequently, as shown in FIG. 7B, a sealing member 310 is filled in a gap between the driving substrate 100 and the opposite substrate 200, and proper pressing forces are applied thereto by means of pressing heads 302 so as to seal the driving substrate 100 and the opposite substrate 200. Then, as shown in FIG. 7C, the pressing heads 302 continuously press against the driving substrate 100 and the opposite substrate 200 so as to hold same, and a grinding process is performed, by means of a grinding mechanism, for example, a grinding wheel 304, to remove the redundant sealing member 310 that protrudes from sides of the display panel 10. In other embodiments, part of the driving substrate 100 and the opposite substrate 200 may also be grinded, so that the sides of the display panel 10 are flattened, and that the contacts 102 on the driving substrate 100 are exposed out of the sealing member 310 and the side of the display panel 10.

Subsequently, as shown in FIG. 7D, a plurality of conductive patterns 12 is disposed on a side of the display panel 10, and the positions of the conductive patterns 12 correspond to the positions of the contacts 102. In an embodiment, the conductive patterns 12 may be formed by patterning a metal layer, for example, by patterning a metal layer by using a laser 306. In other embodiments, the conductive patterns 12 may also be manufactured on the side of the display panel 10 by means of ink-jet printing, flexo printing, gravure printing, or the like, and respectively be connected to the corresponding contacts 102.

Then, as shown in FIG. 7E, a joining process is then performed, to join a (flexible) circuit board 400 with the display panel 10. In an embodiment, the (flexible) circuit board 400 includes a plurality of pads 410, and the joining process includes a hot pressing process, so that the pads 410 on the (flexible) circuit board 400 are joined with the conductive patterns 12 on the side of the display panel 10. The pressing force applied to the (flexible) circuit board 400 by a hot pressing mechanism 308 in the hot pressing process is extremely large, and therefore the pressing heads fixed onto the driving substrate 100 and the opposite substrate 200 are also correspondingly changed to pressing heads 302' of relatively large sizes, so as to increase the holding capability.

Finally, as shown in FIG. 7F, a protective layer 420 is coated on outsides of the display panel 10 and the flexible circuit board 400, to protect the display panel 10 and the flexible circuit board 400 and isolate external moisture and oxygen, so as to reduce the probability of contact of moisture and oxygen with a connection interface between of the display panel 10 and the flexible circuit board 400.

As can be known from FIG. 7A to FIG. 7F, an implementation of the present invention provides a method for remanufacturing a display panel of a large size into a display panel of a small size, and obtaining a display device by connecting a flexible circuit board to conductive patterns on a side of the display panel and connecting contacts in the display panel to pads on the flexible circuit board by means of the conductive patterns on the side of the display panel. The drive circuits for all pixels on the driving substrate are substantially the same, and therefore a relatively small display panel of a desired size can be obtained after cutting along a scribe line, so that remanufacturing of the display panel becomes more flexible.

Subsequently, referring to FIG. 8 to FIG. 11, FIG. 8 to FIG. 11 respectively are side views of a display device according to different embodiments of the present invention. The difference among the embodiments mainly lies in that the approaches of connection between the display panel 10 and the flexible circuit board 400 are different. A display device 500 includes a driving substrate 100, an opposite substrate 200, and a flexible circuit board 400. The driving substrate 100 includes contacts that are exposed out of a side of the driving substrate 100. The opposite substrate 200 also includes a conductive layer 220 that is exposed out of a side of the opposite substrate 200. The flexible circuit board 400 is connected to the contacts and the conductive layer 220 by means of conductive patterns. In an embodiment, the contacts include a gate contact 160 and a common contact 186, and the conductive layer 220 does not directly contact the gate contact 160 or the common contact 186. In another embodiment, the contacts that are exposed out of the side of the driving substrate 100 may be source contacts, of which the connection approach is similar to that of the gate contacts 160, and details are not described herein.

Figure 8:
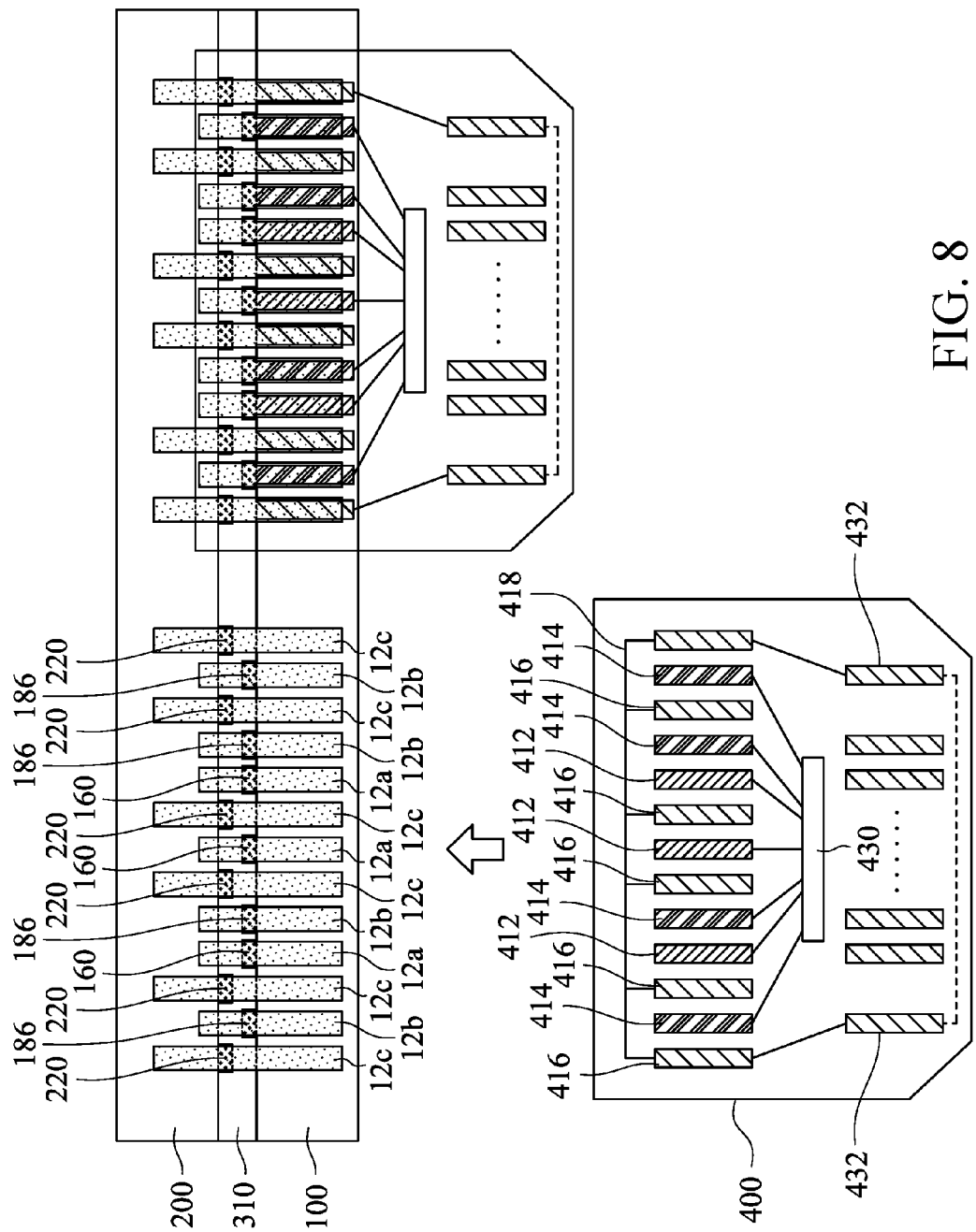
FIG. 8 to FIG. 11 respectively are side views of a display device according to different embodiments of the present invention.

As shown in FIG. 8, the gate contacts 160 and the common contacts 186 are exposed out of the side of the driving substrate 100, and the conductive layers 220 are exposed out of the side of the opposite substrate 200. The display device 500 includes a plurality of first conductive patterns 12a, a plurality of second conductive patterns 12b, and a plurality of third conductive patterns 12c, which may be formed on the sides of the driving substrate 100 and the opposite substrate 200 by means of patterning a metal layer, ink-jet printing, flexo printing, gravure printing, or the like. The first conductive patterns 12a are connected to at least some of the gate contacts 160. The second conductive patterns 12b are connected to at least some of the common contacts 186. The third conductive patterns 12c are connected to at least some of the conductive layers 220.

The flexible circuit board 400 may be a driver circuit board, on which a driver chip 430, a plurality of first pads 412, a plurality of second pads 414, and a plurality of third pads 416 are provided. The first pads 412 correspond to the first conductive patterns 12a, the second pads 414 correspond to the second conductive patterns 12b, and the third pads 416 correspond to the third conductive patterns 12c. The first pads 412 and the second pads 414 are connected to the driver chip 430. In an embodiment, the first pads 412 and the second pads 414 are one-to-one connected to corresponding pins of the driver chip 430. In an embodiment, the conductive layers 220 are used as common electrodes of a liquid crystal capacitor, the flexible circuit board 400 further includes leads 418, and the leads 418 connect the plurality of third pads 416, so that voltages can be directly supplied to some of the third pads 416 and do not need to be applied one-to-one to the individual third pads 416.

The flexible circuit board 400 further includes a plurality of connection terminals 432. The connection terminals 432 may be connected to another circuit board, another control module, or another electronic element or voltage source. For example, the connection terminals 432 include a voltage input terminal, which may be connected to a voltage source in another control module, for supplying power to the display device 500.

Figure 9:
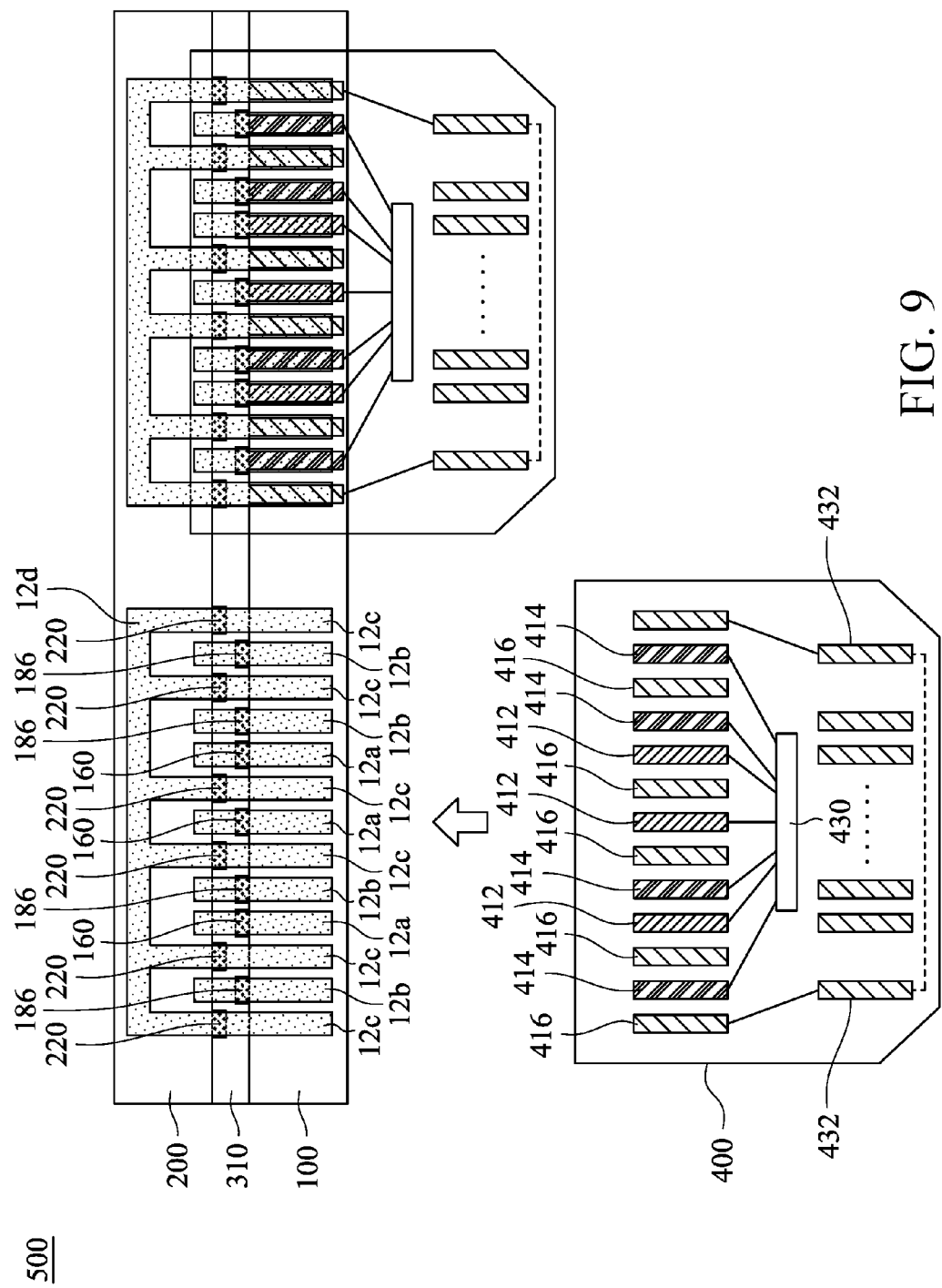

In another embodiment, as shown in FIG. 9, the gate contacts 160 and the common contacts 186 are exposed out of the side of the driving substrate 100, and the conductive layers 220 are exposed out of the side of the opposite substrate 200. The first conductive patterns 12a are connected to the gate contacts 160, the second conductive patterns 12b are connected to the common contacts 186, and the third conductive patterns 12c are connected to the conductive layers 220. The flexible circuit board 400 may be a driver circuit board, on which a driver chip 430, a plurality of first pads 412, a plurality of second pads 414, and a plurality of third pads 416 are provided. The first pads 412 correspond to the first conductive patterns 12a, the second pads 414 correspond to the second conductive patterns 12b, and the third pads 416 correspond to the third conductive patterns 12c.

In an embodiment, the first pads 412 and the second pads 414 are connected to the driver chip 430. The first pads 412 and the second pads 414 are one-to-one connected to corresponding pins of the driver chip 430. In an embodiment, the conductive layers 220 are used as common electrodes of a liquid crystal capacitor. Therefore, the display device 500 further includes connection lines 12d, and the connection lines 12d are disposed on the side of the opposite substrate 200 and connect the third pads 416, so that voltages can be directly supplied to some of the third pads 416 and do not need to be applied one-to-one to the individual third pads 416.

Figure 10:
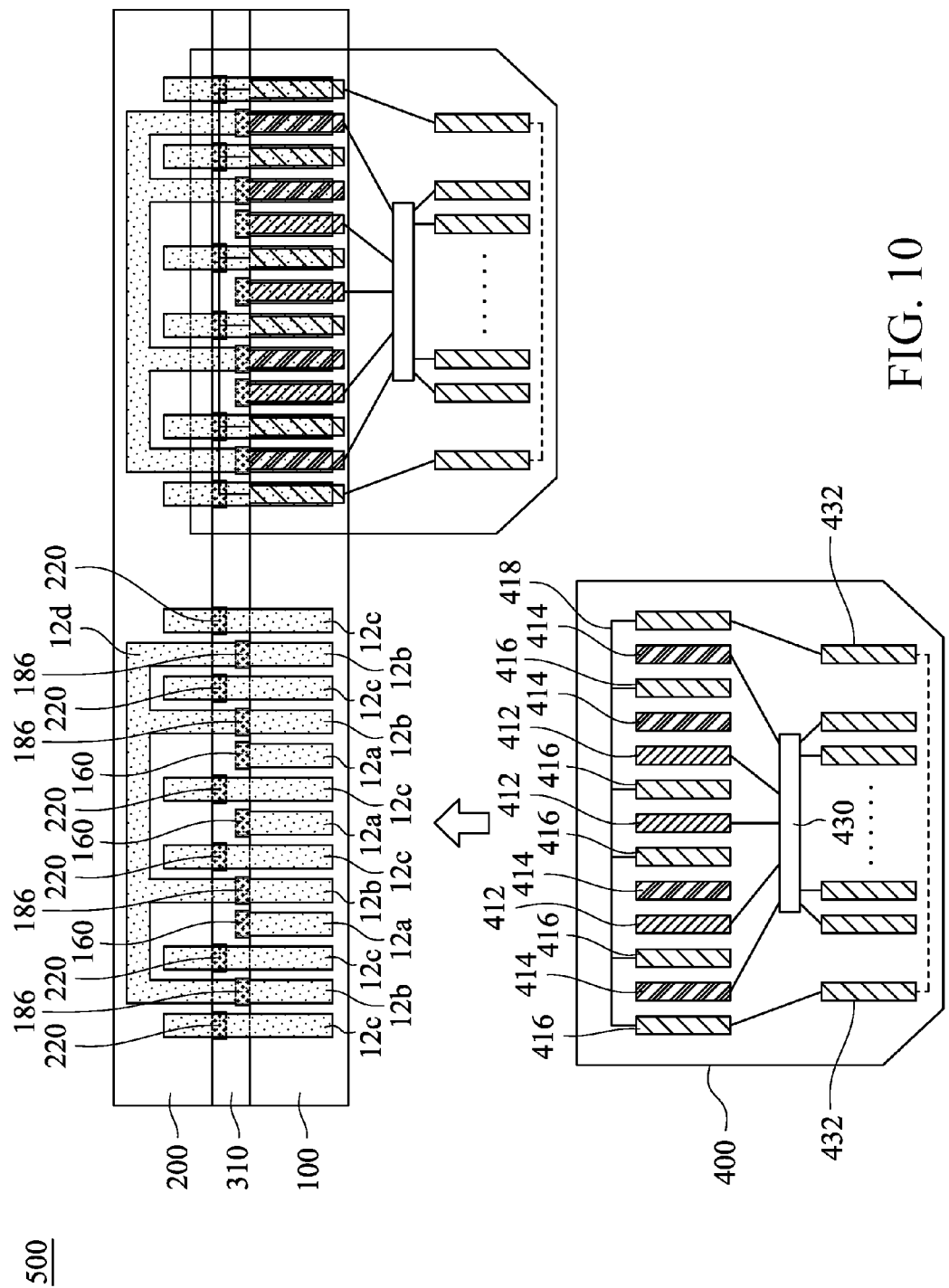

In another embodiment, as shown in FIG. 10, the gate contacts 160 and the common contacts 186 are exposed out of the side of the driving substrate 100, and the conductive layers 220 are exposed (the term "expose" in the text indicates that elements are exposed during a manufacturing/operating process, but not limit that the elements still need to be exposed in the final product) out of the side of the opposite substrate 200. The first conductive patterns 12a are connected to the gate contacts 160, the second conductive patterns 12b are connected to the common contacts 186, and the third conductive patterns 12c are connected to the conductive layers 220. The flexible circuit board 400 may be a driver circuit board, on which a driver chip 430, a plurality of first pads 412, a plurality of second pads 414, and a plurality of third pads 416 are provided. The first pads 412 correspond to the first conductive patterns 12a, the second pads 414 correspond to the second conductive patterns 12b, and the third pads 416 correspond to the third conductive patterns 12c.

In an embodiment, the first pads 412 are one-to-one connected to corresponding pins of the driver chip 430, so as to connect the gate contact 160 and the driver chip 430. In an embodiment, the common contacts 186 are used as common electrodes of a storage capacitor. The display device 500 further includes connection lines 12d, and the connection lines 12d are disposed on the side of the opposite substrate 200 and connect the second pads 414, so that voltages can be directly supplied to some of the second pads 414 and do not need to be applied one-to-one to the individual second pads 414. In an embodiment, the conductive layers 220 are used as common electrodes of a liquid crystal capacitor, the flexible circuit board 400 further includes leads 418, and the leads 418 connect the plurality of third pads 416, so that voltages can be directly supplied to some of the third pads 416 and do not need to be applied one-to-one to the individual third pads 416.

Figure 11:
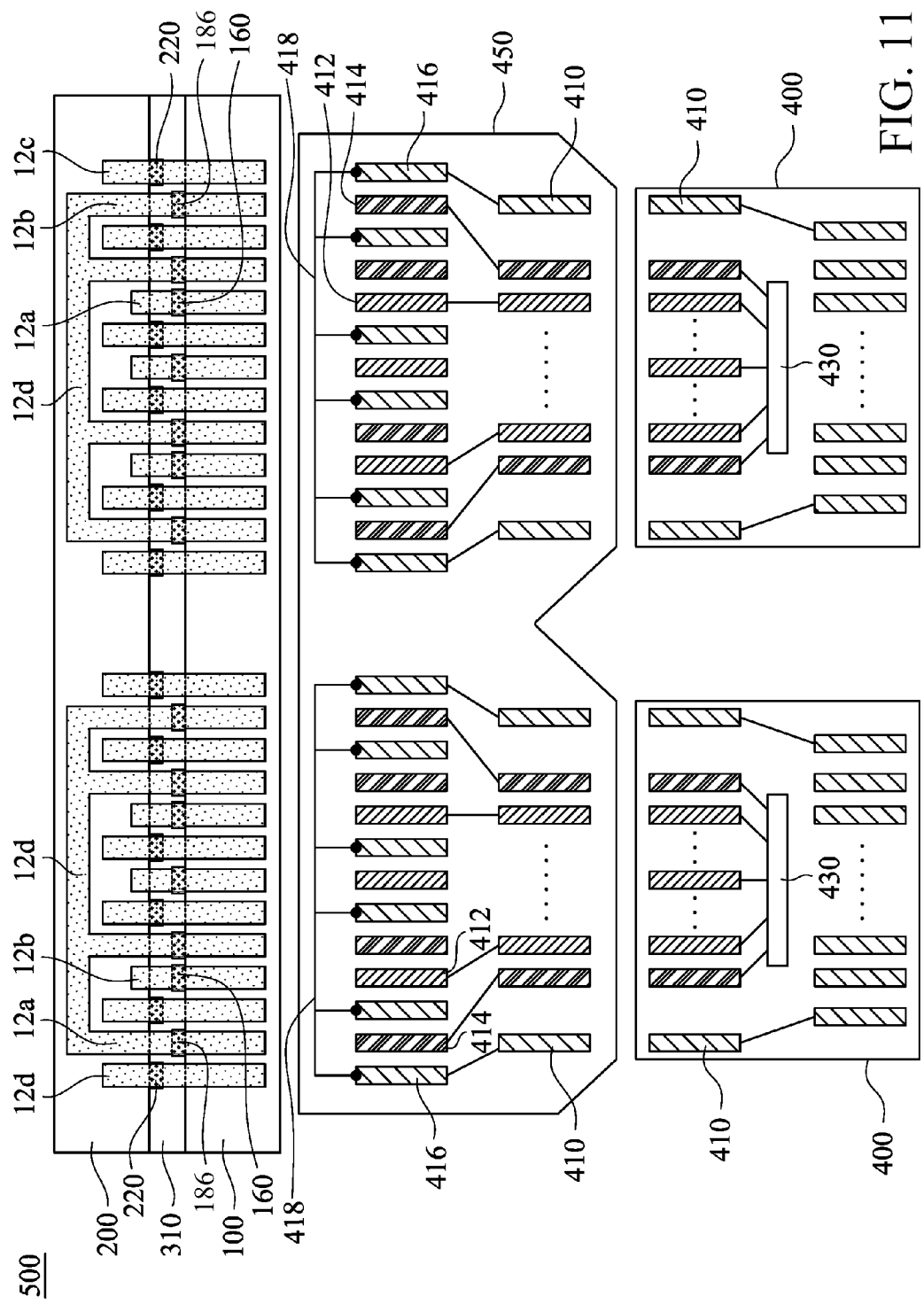

In another embodiment, as shown in FIG. 11, the gate contacts 160 and the common contacts 186 are exposed out of the side of the driving substrate 100, and the conductive layers 220 are exposed out of the side of the opposite substrate 200. The first conductive patterns 12a are connected to the gate contacts 160, the second conductive patterns 12b are connected to the common contacts 186, and the third conductive patterns 12c are connected to the conductive layers 220.

In an embodiment, for example, when the density of contacts is relatively high, the flexible circuit board 400 on which the driver chip 430 is disposed (hereinafter referred to as driver circuit board 400) may further be connected to the first to third conductive patterns 12a, 12b, and 12c by means of a transfer circuit board 450. The transfer circuit board 450 may be a flexible circuit board, which connects the first to third conductive patterns 12a, 12b, and 12c to the driver circuit board 400 in a fan-in manner.

A plurality of first pads 412, a plurality of second pads 414, and a plurality of third pads 416 are provided on the transfer circuit board 450. In an embodiment, the transfer circuit board 450 further includes leads 418, and the leads 418 connect the plurality of third pads 416, so that voltages can be conducted to all of the third conductive patterns 12c and conductive layers 220 by only being supplied to some of the third pads 416. Similarly, the display device 500 further includes connection lines 12d, and the connection lines 12d connect the second conductive patterns 12b, so that voltages can be conducted to all of the second conductive patterns 12b and common contacts 186 by only being supplied to some of the second pads 414. In another embodiment, the leads 418 may connect the second pads 414, and the connection lines 12d may connect the second conductive patterns 12b. In this way, the number of pads 410 on the driver circuit board 400 can drop greatly, so as to reduce the density of connection lines on the driver circuit board 400.

In view of the above, the present invention provides a display device of which the size can be reset and a method for manufacturing same. After a display panel is cut, conductive layers and contacts are exposed out of a side of the display panel, and then conductive patterns are further disposed on the side of the display panel, so that a display device of a desired size can be obtained by connecting a flexible circuit board and the display panel by means of the conductive patterns.

The present invention is disclosed through the foregoing embodiments; however, these embodiments are not intended to limit the present invention. Various changes and modifications made by persons of ordinary skill in the art without departing from the spirit and scope of the present invention shall fall within the protection scope of the present invention. The protection scope of the present invention is subject to the appended claims.

What is claimed is:

1. A method for manufacturing a display device, comprising:
   cutting a display panel to expose a plurality of contacts out of a side of the display panel;
   filling a sealing member in the side, and removing a part of the sealing member to still expose the contacts out of the side of the display panel;
   forming a plurality of conductive patterns on the side of the display panel, the conductive patterns being connected to the contacts; and
   connecting a plurality of pads on a flexible circuit board to the conductive patterns.

2. The method for manufacturing a display device according to claim 1, wherein the forming a plurality of conductive patterns comprises:
   forming a metal layer on the side; and
   patterning the metal layer.

3. The method for manufacturing a display device according to claim 1, wherein the forming a plurality of conductive patterns comprises:
   printing a conductive material on the side.

4. The method for manufacturing a display device according to claim 1, wherein the contacts comprise a gate contact, a source contact, a common contact, or a combination thereof.

* * * * *